United States Patent
Fujii et al.

(10) Patent No.: US 9,461,158 B2
(45) Date of Patent: Oct. 4, 2016

(54) HETEROJUNCTION FIELD EFFECT TRANSISTOR

(71) Applicant: SHARP KABUSHIKI KAISHA, Osaka-shi, Osaka (JP)

(72) Inventors: Norihisa Fujii, Osaka (JP); Tetsuzo Nagahisa, Osaka (JP); Masaru Kubo, Osaka (JP)

(73) Assignee: SHARP KABUSHIKI KAISHA, Osaka (JP)

( * ) Notice: Subject to any disclaimer, the term of this patent is extended or adjusted under 35 U.S.C. 154(b) by 0 days.

(21) Appl. No.: 14/785,504

(22) PCT Filed: Feb. 28, 2014

(86) PCT No.: PCT/JP2014/055016
§ 371 (c)(1),
(2) Date: Oct. 19, 2015

(87) PCT Pub. No.: WO2014/199671
PCT Pub. Date: Dec. 18, 2014

(65) Prior Publication Data
US 2016/0079404 A1    Mar. 17, 2016

(30) Foreign Application Priority Data

Jun. 13, 2013  (JP) ................................ 2013-124546

(51) Int. Cl.
*H01L 29/778* (2006.01)
*H01L 29/417* (2006.01)
(Continued)

(52) U.S. Cl.
CPC ........... *H01L 29/778* (2013.01); *H01L 29/205* (2013.01); *H01L 29/41725* (2013.01);
(Continued)

(58) Field of Classification Search
CPC ........... H01L 29/41758; H01L 29/778; H01L 29/41775
See application file for complete search history.

(56) References Cited

U.S. PATENT DOCUMENTS 7,465,997 B2 * 12/2008 Kinzer ................ H01L 27/0605
257/192
2011/0316045 A1 * 12/2011 Liu .................... H01L 29/42316
257/192

(Continued)

FOREIGN PATENT DOCUMENTS

| JP | 2010-147349 A | 7/2010 |
| JP | 2012-238808 A | 12/2012 |
| JP | 2012-248588 A | 12/2012 |
| JP | 2012248588 A * | 12/2012 |

OTHER PUBLICATIONS

English translation of JP 2012-248588 A, provided by AIPN, Dec. 13, 2012.*

*Primary Examiner* — Allen Parker
*Assistant Examiner* — Stephen Bradley
(74) *Attorney, Agent, or Firm* — Birch, Stewart, Kolasch & Birch, LLP (57) ABSTRACT

A heterojunction field effect transistor includes a first contact portion and a second contact portion. A length of the first contact portion in a longitudinal direction is smaller than a length of source electrodes in the longitudinal direction, and a length of the second contact portion in the longitudinal direction is smaller than a length of drain electrodes in the longitudinal direction. For each drain electrode, a distance from ends of the second contact portion to ends of the drain electrode, the ends being outside of the second contact portion, is greater than a distance from ends of the first contact portion to ends of the source electrode, the ends being outside of the first contact portion.

4 Claims, 6 Drawing Sheets (51) Int. Cl.
  *H01L 29/205* (2006.01)
  *H01L 29/40* (2006.01)
  *H01L 29/20* (2006.01)
  *H01L 29/423* (2006.01)

(52) U.S. Cl.
  CPC ..... *H01L29/41758* (2013.01); *H01L 29/7786* (2013.01); *H01L 29/2003* (2013.01); *H01L 29/402* (2013.01); *H01L 29/41766* (2013.01); *H01L 29/42316* (2013.01)

(56) References Cited

U.S. PATENT DOCUMENTS

| | | | |
|---|---|---|---|
| 2013/0214330 A1* | 8/2013 | Briere | H01L 29/7788 257/194 |
| 2014/0015019 A1* | 1/2014 | Okamoto | H01L 29/78 257/288 |
| 2016/0043208 A1* | 2/2016 | Ikoshi | H01L 29/407 257/192 |

* cited by examiner

|  | COMPARATIVE EXAMPLE | EMBODIMENT |
|---|---|---|
| NON-DEFECTIVE RATE IN SCREENING TEST | 66.2% | 68.8% |
| DEFECTIVE RATE IN HIGH-TEMPERATURE REVERSE BIAS TEST | 17.3% | 9.9% |

HETEROJUNCTION FIELD EFFECT TRANSISTOR

TECHNICAL FIELD

The present invention relates to a GaN-based heterojunction field effect transistor (HFET).

BACKGROUND ART

Japanese Unexamined Patent Application Publication No. 2012-238808 (PTL 1) describes a GaN-based HFET. GaN used in this HFET has a large band gap, a high breakdown voltage, and a high electron drift velocity, and enables utilization of two-dimensional electron gas generated by a heterojunction. For example, when an AlGaN layer is stacked on an undoped GaN layer, two-dimensional electron gas is generated on a hetero-interface due to spontaneous polarization and piezoelectric polarization. HFETs that utilize the two-dimensional electron gas as a channel are known. Such an HFET may be applied to a power device for controlling a large current, and is advantageous in that the size thereof can be reduced compared to that of a Si-based HFET by exploiting the characteristics of the GaN-based HFET, such as low on-resistance.

In the above-described GaN-based HFET, a source wire and a drain wire are disposed in an active region of a device. A source electrode and a drain electrode are electrically connected to the source wire and the drain wire, respectively, via contact portions.

CITATION LIST

Patent Literature

PTL 1: Japanese Unexamined Patent Application Publication No. 2012-238808

SUMMARY OF INVENTION

Technical Problem

In the case where GaN-based HFETs are used in power supply circuits for commercial products, high-current (several tens of amperes) HFETs need to be provided. To increase the HFET current, a plurality of finger-shaped HFETs are arranged in parallel, and wires need to be arranged to draw a current from the HFETs through contact portions.

However, when the above-described GaN-based HFET of the related art is subjected to a high-temperature reverse bias test (for example, 200° C. and 600 V), an element breakdown or deterioration occurs at the ends of the contact portions in a short time, and the reliability is reduced.

More specifically, since an electric field generated when a high voltage is applied to the drain electrode is concentrated at the ends of the contact portions, the current is locally concentrated and affects flaws around the ends of the contact portions. Accordingly, the lifespan is reduced and an element breakdown occurs.

An object of the present invention is to provide a GaN-based HFET with which the reliability can be increased by suppressing an electric field concentration at the ends of contact portions and preventing an element breakdown and deterioration.

Solution to Problem

To achieve the above-described object, a heterojunction field effect transistor according to the present invention includes:
a GaN-based multilayer body having a heterojunction;
a plurality of finger-shaped drain electrodes formed parallel to each other on the GaN-based multilayer body;
a plurality of finger-shaped source electrodes formed parallel to each other on the GaN-based multilayer body such that the source electrodes and the drain electrodes are alternately arranged in an arrangement direction of the drain electrodes;
gate electrodes formed in regions between the drain electrodes and the source electrodes in plan view;
an interlayer insulating film formed on the GaN-based multilayer body so as to cover the source electrodes, the drain electrodes, and the gate electrodes;
first contact portions formed in the interlayer insulating film in regions above at least portions of the respective source electrodes, the first contact portions extending in a longitudinal direction of the source electrodes; and
second contact portions formed in the interlayer insulating film in regions above at least portions of the respective drain electrodes, the second contact portions extending in a longitudinal direction of the drain electrodes.

A length of the first contact portions in the longitudinal direction is smaller than a length of the source electrodes in the longitudinal direction.

A length of the second contact portions in the longitudinal direction is smaller than a length of the drain electrodes in the longitudinal direction.

For each drain electrode, a distance from ends of the second contact portion to ends of the drain electrode, the ends being outside the second contact portion, is greater than a distance from ends of the first contact portion to ends of the source electrode, the ends being outside the first contact portion.

In one embodiment, the heterojunction field effect transistor further includes source wires that are formed on the interlayer insulating film and electrically connected to the source electrodes by the first contact portions.

In one embodiment, in the heterojunction field effect transistor, in plan view, the gate electrodes extend in the longitudinal direction of the drain electrodes in the regions between the drain electrodes and the source electrodes, and also extend so as to surround both ends of the drain electrodes in the longitudinal direction.

Advantageous Effects of Invention

According to the HFET of the present invention, a GaN-based HFET can be provided with which the reliability can be increased by suppressing an electric field concentration at the ends of the contact portions and preventing an element breakdown and deterioration.

DESCRIPTION OF EMBODIMENTS

Embodiments of the present invention illustrated in the drawings will be described in detail.

First Embodiment

Figure 1:
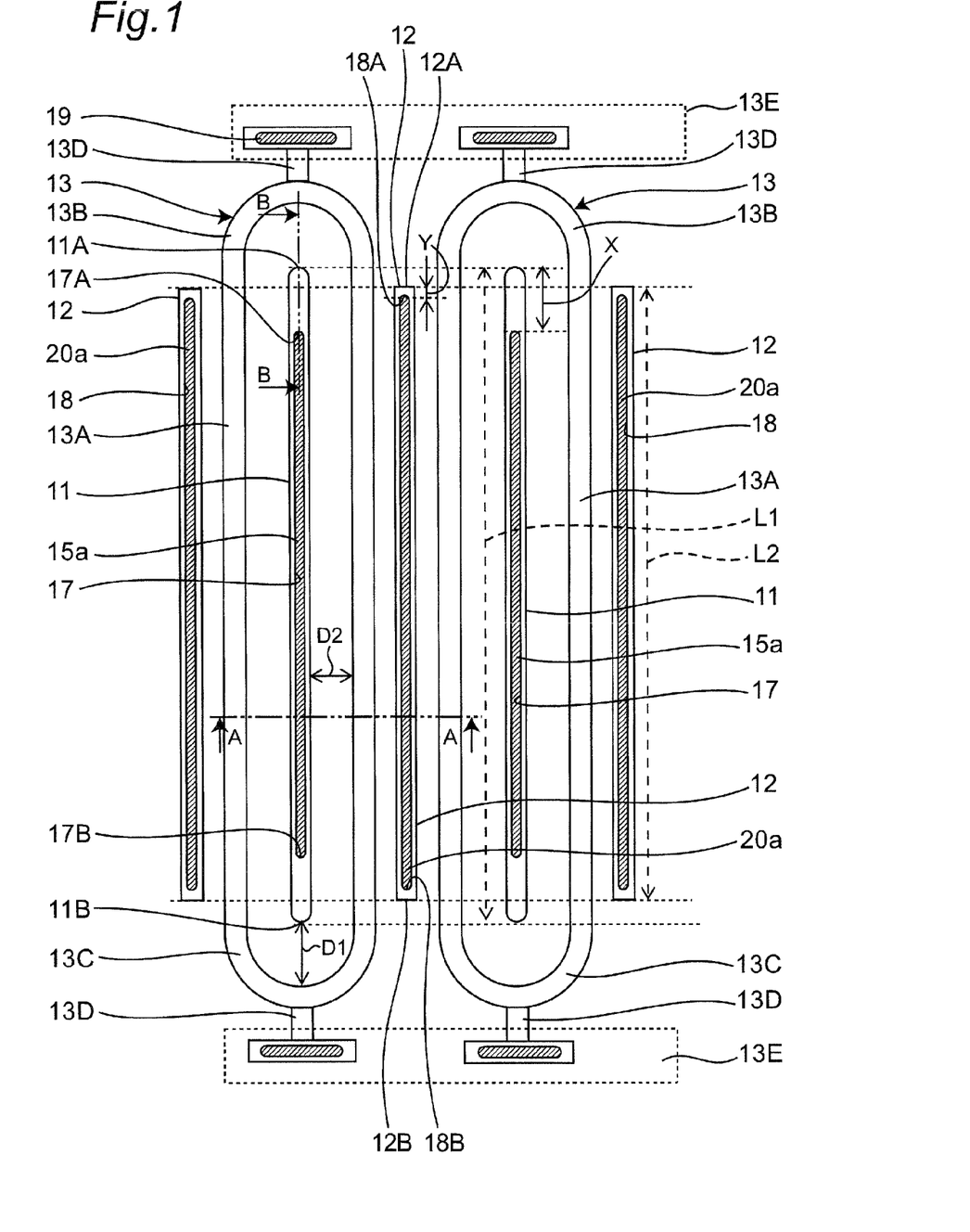
FIG. 1 is a schematic plan view illustrating an electrode structure of a GaN-based HFET according to a first embodiment of the present invention.
Figure 2:
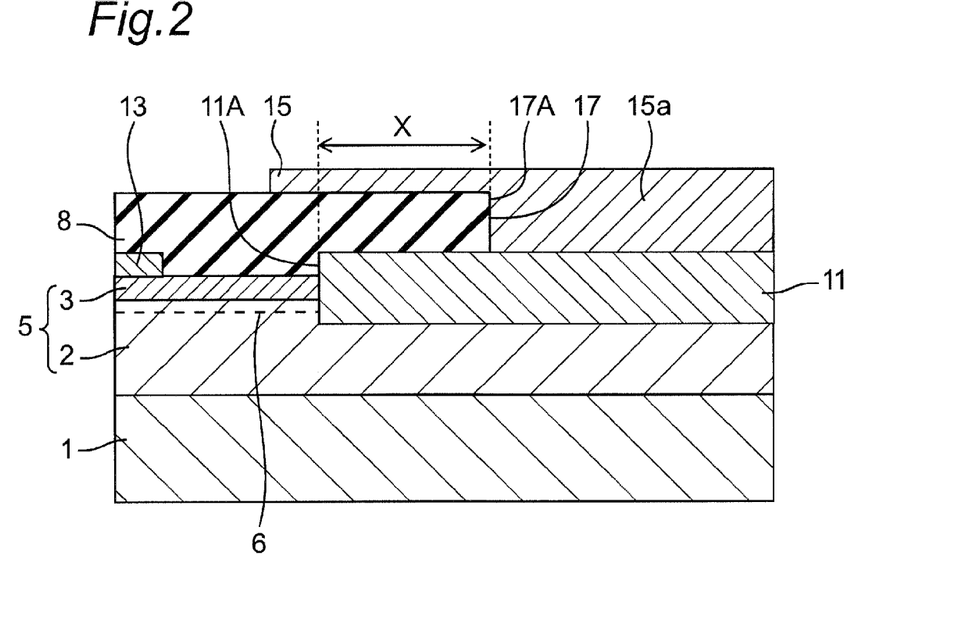
FIG. 2 is a sectional view of FIG. 1 taken along line B-B.
Figure 3:
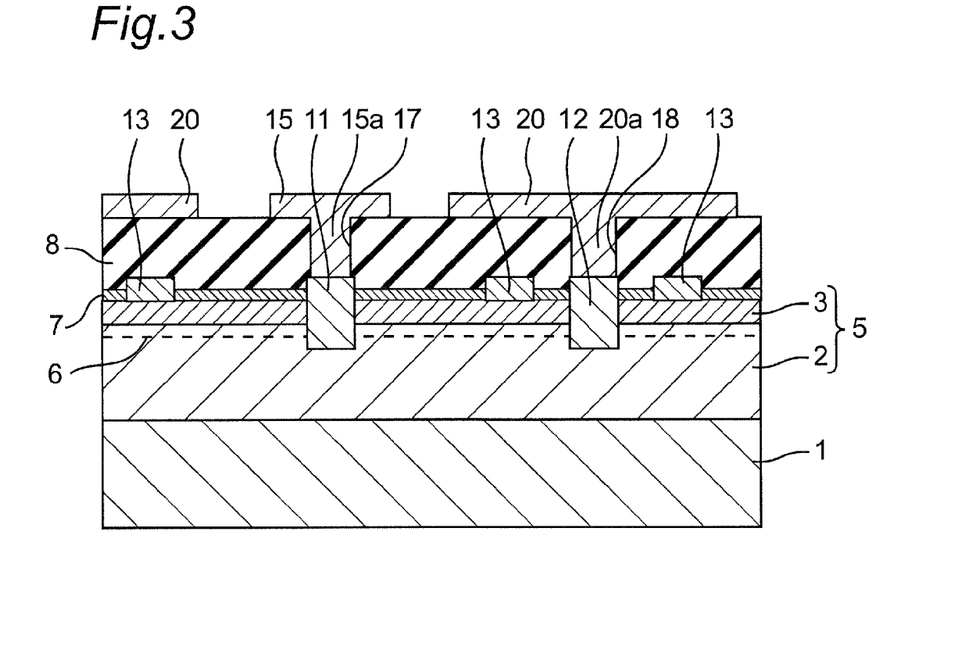
FIG. 3 is a sectional view of FIG. 1 taken along line A-A.

FIG. 1 is a schematic plan view illustrating an electrode structure of a GaN-based HFET according to a first embodiment of the present invention. FIG. 2 is a sectional view of FIG. 1 taken along line B-B. FIG. 3 is a sectional view of FIG. 1 taken along line A-A.

As illustrated in FIGS. 2 and 3, in the first embodiment, an undoped GaN layer 2 and an undoped AlGaN layer 3 are formed on a Si substrate 1. The undoped GaN layer 2 and the undoped AlGaN layer 3 form a GaN-based multilayer body 5 having a heterojunction. A channel layer is provided at the interface between the undoped GaN layer 2 and the undoped AlGaN layer 3, the channel layer being formed of 2DEG (two-dimensional electron gas) 6 generated at the interface.

A protective film 7 and an interlayer insulating film 8 are successively formed on the GaN-based multilayer body 5. The protective film 7 is made of SiN. The thickness of the protective film 7 is 150 nm. The material of the interlayer insulating film 8 is, for example, $SiO_2$.

The GaN-based multilayer body 5 has recesses that extend to the undoped GaN layer 2 through the protective film 7 and the interlayer insulating film 8. Drain electrodes 11 and source electrodes 12 are formed in the recesses as ohmic electrodes. The drain electrodes 11 and the source electrodes 12 are Ti/Al/TiN electrodes in which a Ti layer, an Al layer, and a TiN layer are stacked in that order.

The protective film 7 has openings in which gate electrodes 13 are formed. The gate electrodes 13 are WN/W electrodes in which a WN layer and a W layer are successively stacked, and serve as Schottky electrodes that form Schottky junctions with the undoped AlGaN layer 3. In this example, the Schottky junctions formed of the WN/W electrodes and the undoped AlGaN layer 3 are provided. Alternatively, however, an insulating film made of, for example, SiN may be provided between the undoped AlGaN layer 3 and the gate electrodes 13 to form a metal insulator semiconductor heterostructure field effect transistor (MISHFET).

The interlayer insulating film 8 is formed so as to cover the drain electrodes 11, the source electrodes 12, and the gate electrodes 13. Contact holes 17 are formed in the interlayer insulating film 8 in regions above portions of the drain electrodes 11. Contact holes 18 are formed in the interlayer insulating film 8 in regions above portions of the source electrodes 12.

Drain wires 15 are disposed in the contact holes 17 and on the interlayer insulating film 8. The drain wires 15 are electrically connected to the drain electrodes 11. Portions of the drain wires 15 disposed in the contact holes 17 serve as second contact portions 15a.

Source wires 20 are disposed in the contact holes 18 and on the interlayer insulating film 8. The source wires 20 are electrically connected to the source electrodes 12. Portions of the source wires 20 disposed in the contact holes 18 serve as first contact portions 20a. The drain wires 15 and the source wires 20 are composed of, for example, TiN/Al, Ti/Cu, or Ti/Au.

As illustrated in FIG. 1, in this embodiment, two finger-shaped drain electrodes 11 and three finger-shaped source electrodes 12 are provided. The two drain electrodes 11 are formed so as to be parallel to each other. The three source electrodes 12 are formed so as to be parallel to each other such that the source electrodes 12 and the drain electrodes 11 are alternately arranged in an arrangement direction of the drain electrodes 11.

The length L2 of each source electrode 12 in the longitudinal direction is smaller than the length L1 of each drain electrode 11 in the longitudinal direction. In the longitudinal direction, each source electrode 12 is disposed between ends 11A and 11B of each drain electrode 11 in the longitudinal direction.

The first contact portions 20a extend in the longitudinal direction of the source electrodes 12. The length of the first contact portions 20a in the longitudinal direction is smaller than the length of the source electrodes 12 in the longitudinal direction.

The second contact portions 15a extend in the longitudinal direction of the drain electrodes 11. The length of the second contact portions 15a in the longitudinal direction is smaller than the length of the drain electrodes 11 in the longitudinal direction.

The gate electrodes 13 include longitudinal extending portions 13A and curved portions 13B and 13C in plan view. The longitudinal extending portions 13A extend in the longitudinal direction of the drain electrodes 11 in regions between the finger-shaped drain electrodes 11 and the finger-shaped source electrodes 12.

The curved portions 13B extend so as to surround the ends 11A of the drain electrodes 11 in plan view. Each curved portion 13B is connected to ends of the two longitudinal extending portions 13A that are arranged next to each other with the corresponding drain electrode 11 disposed therebetween. The curved portions 13C extend so as to surround the ends 11B of the drain electrodes 11 in plan view. Each curved portion 13C is connected to the other ends of the two longitudinal extending portions 13A that are arranged next to each other with the corresponding drain electrode 11 disposed therebetween.

The two longitudinal extending portions 13A and the curved portions 13B form an annular portion that is connected to branch portions 13D that extend in the longitudinal direction. The branch portions 130 are connected to connecting portions 13E, which extend in a direction perpendicular to the longitudinal direction, through contact holes 19. As illustrated in FIG. 1, each of the longitudinal extending portions 13A of the gate electrodes 13 is positioned such that, in the arrangement direction of the drain electrodes 11, the distance to the adjacent source electrode 12 is smaller than the distance to the adjacent drain electrode 11.

The ratio of the distance D2 from the drain electrodes 11 to the longitudinal extending portions 13A of the gate electrodes 13 in the arrangement direction to the distance D1 from the ends 11A and 11B of the drain electrodes 11 to the curved portions 13B and 13C of the gate electrodes 13 in the longitudinal direction of the drain electrodes 11 is 1:1.5.

The distance X from the ends 11A and 11B of the drain electrodes 11 in the longitudinal direction to ends 17A and 17B of the second contact portions 15a in the longitudinal direction is greater than the distance Y from ends 12A and 12B of the source electrodes 12 in the longitudinal direction to ends 18A and 18B of the first contact portions 20a in the longitudinal direction.

The GaN-based HFET having the above-described structure is of a normally-on type, and is turned off when a negative voltage is applied to the gate electrodes 13.

Figure 4:
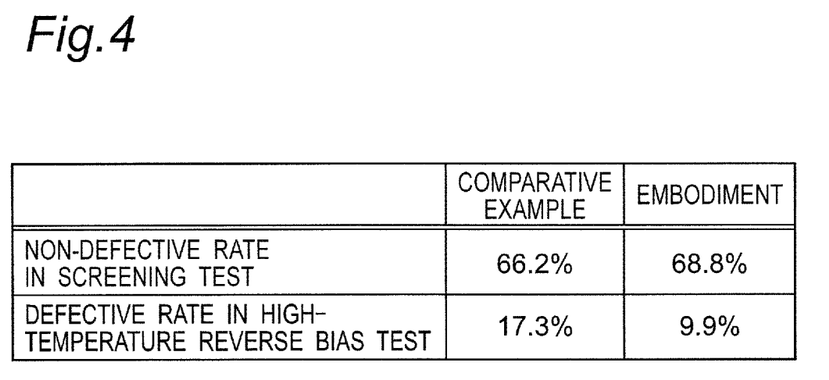
FIG. 4 is a table showing the result of reliability tests of GaN-based HFETs according to the first embodiment and GaN-based HFETs according to a comparative example.
Figure 5:
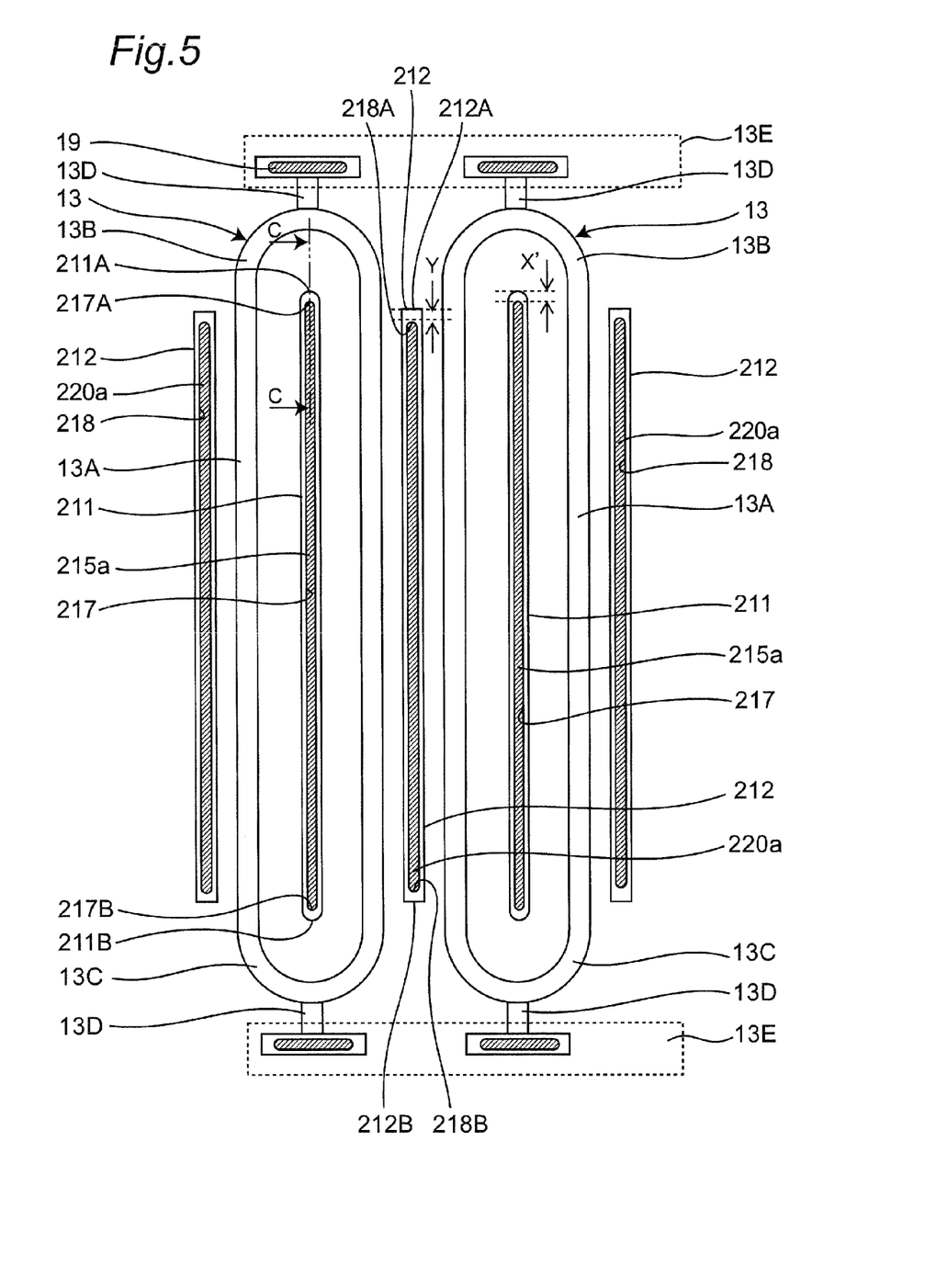
FIG. 5 is a schematic plan view illustrating an electrode structure of a GaN-based HFET according to the comparative example.
Figure 6:
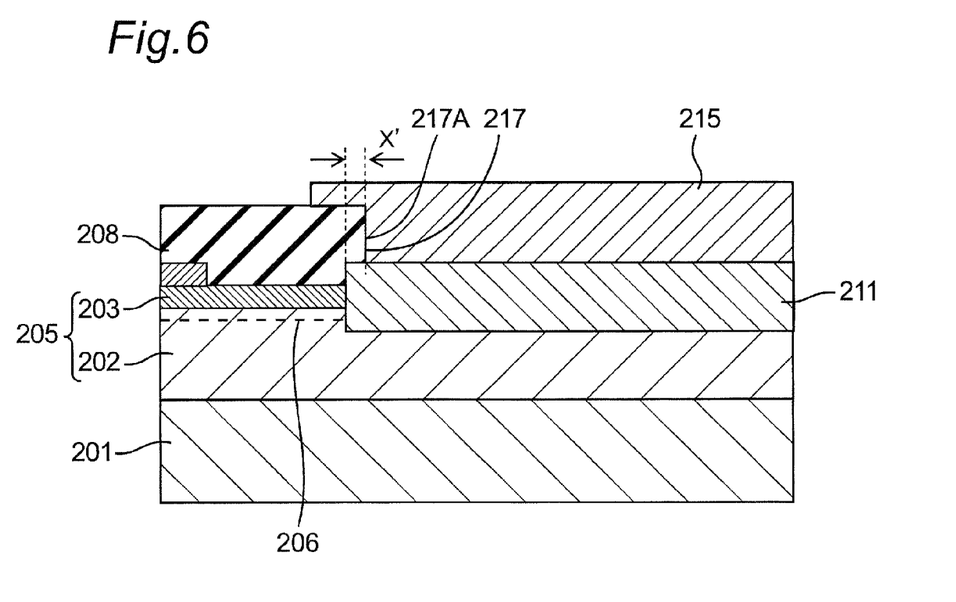
FIG. 6 is a sectional view of FIG. 5 taken along line C-C.

FIG. 4 shows the result of reliability tests of GaN-based HFETs according to the first embodiment and GaN-based HFETs according to a comparative example. FIG. 5 is a schematic plan view illustrating an electrode structure of a GaN-based HFET according to the comparative example. The GaN-based HFET according to the comparative example is described for the purpose of comparison, and is not included in the present invention.

As illustrated in FIG. 5, the GaN-based HFET of the comparative example differs from the GaN-based HFET of the first embodiment only in that the distance X from ends 211A of drain electrodes 211 in the longitudinal direction to ends 217A of second contact portions 215a in the longitudinal direction is equal to the distance Y from ends 212A of source electrodes 212 in the longitudinal direction to ends 218A of the first contact portions 220a in the longitudinal direction.

As shown in FIG. 4, in a screening test, the yield (non-defective rate) of GaN-based HFETs according to the comparative example was 66.2%. The screening test is performed as follows. That is, in an off-state in which a voltage of −10 V is continuously applied to the gate electrodes 13, a voltage of 0 V is applied to the source electrodes 212, and a voltage applied to the drain electrodes 211 is changed to 600 V in steps of +100V. Then, whether or not a breakdown, such as a dielectric breakdown or short-circuiting, or deterioration of characteristics has occurred is observed. In the screening test, short-circuiting occurred between the source electrodes 212 and the drain electrodes 211.

In a high-temperature reverse bias test, the defective rate of the above-described comparative example was 17.3%. The high-temperature reverse bias test is performed as follows. That is, for example, in an off-state in which a voltage of −10 V is continuously applied to the gate electrodes 13 in a high-temperature environment (200° C.), a voltage of 0 V is applied to the source electrodes 212, and a voltage of 600 V is continuously applied to the drain electrodes 211 for 5 minutes. Then, whether or not an element breakdown or deterioration of element characteristics has occurred is observed. The rate of the samples of the comparative example that passed the screening test but were found to be defective after the high-temperature reverse bias test was as high as one-fourth. As a result of analysis of the samples of the comparative example after the high-temperature reverse bias test, it was found that the dielectric breakdown occurred at the ends 211A and 211B of the drain electrodes 211 or at the ends 217A and 217B of the second contact portions 215a.

In the high-temperature reverse bias test, defects in the samples of the comparative example presumably occurred due to the following reasons. That is, in the off-state in which a voltage is continuously applied to the gate electrodes 13, an electric field generated when a high voltage of 600 V is applied to the drain electrodes 211 is concentrated at the ends 211A and 211B of the drain electrodes 211 and the ends 217A and 217B of the second contact portions 215a. Therefore, the current is locally concentrated and affects flaws around the ends 211A and 211B of the drain electrodes 211 and the ends 217A and 217B of the second contact portions 215a. As a result, the lifespan is reduced and a breakdown occurs, which causes the defects in the samples. In other words, the cause of the defects in the high-temperature reverse bias test is probably the electric field concentration at the ends 211A and 211B of the drain electrodes 211 and the ends 217A and 2173 of the second contact portions 215a.

In the high-temperature reverse bias test, the defective rate of the GaN-based HFETs according to the present embodiment was 9.9%, which is lower by 7% or more than the defective rate of the comparative example, which was 17.3%. The result of the screening test for the present embodiment was 68.8%, which is similar to the above-described result for the comparative example.

Thus, it has been found that, according to the first embodiment, the occurrence of defects in the HFETs can be reduced in the high-temperature reverse bias test. This is because, according to the present embodiment, since the distance X from the ends 11A and 11B of the drain electrodes 11 to the ends 17A and 17B of the second contact portions 15a is greater than the distance Y from the ends 12A and 12B of the source electrodes 12 to the ends 18A and 18B of the first contact portions 20a, the electric field concentration at the ends 11A and 11B of the drain electrodes 11 and the ends 17A and 17B of the second contact portions 15a can be suppressed.

In particular, in the first embodiment, a plurality of finger-shaped drain electrodes 11 and a plurality of finger-shaped source electrodes 12 are provided. Therefore, the occurrence of an element breakdown or deterioration at the ends 17A and 17B of the second contact portions 15a can be significantly reduced, and the reliability can be increased.

In addition, in the first embodiment, the source wires 20, which are electrically connected to the source electrodes 12 by the first contact portions 20a, are disposed above the source electrodes 12. Owing to such a three-dimensional structure, the chip area can be reduced.

In addition, in the first embodiment, the gate electrodes 13 extend so as to surround both ends 11A and 113 of the drain electrodes 11 in the longitudinal direction. Therefore, an electric field concentration at the ends 11A and 11B of the drain electrodes 11 can be suppressed in an off-state breakdown voltage test, and the static off-state breakdown voltage can be increased.

Second Embodiment

A GaN-based HFET according to a second embodiment of the present invention will be described.

Figure 7:
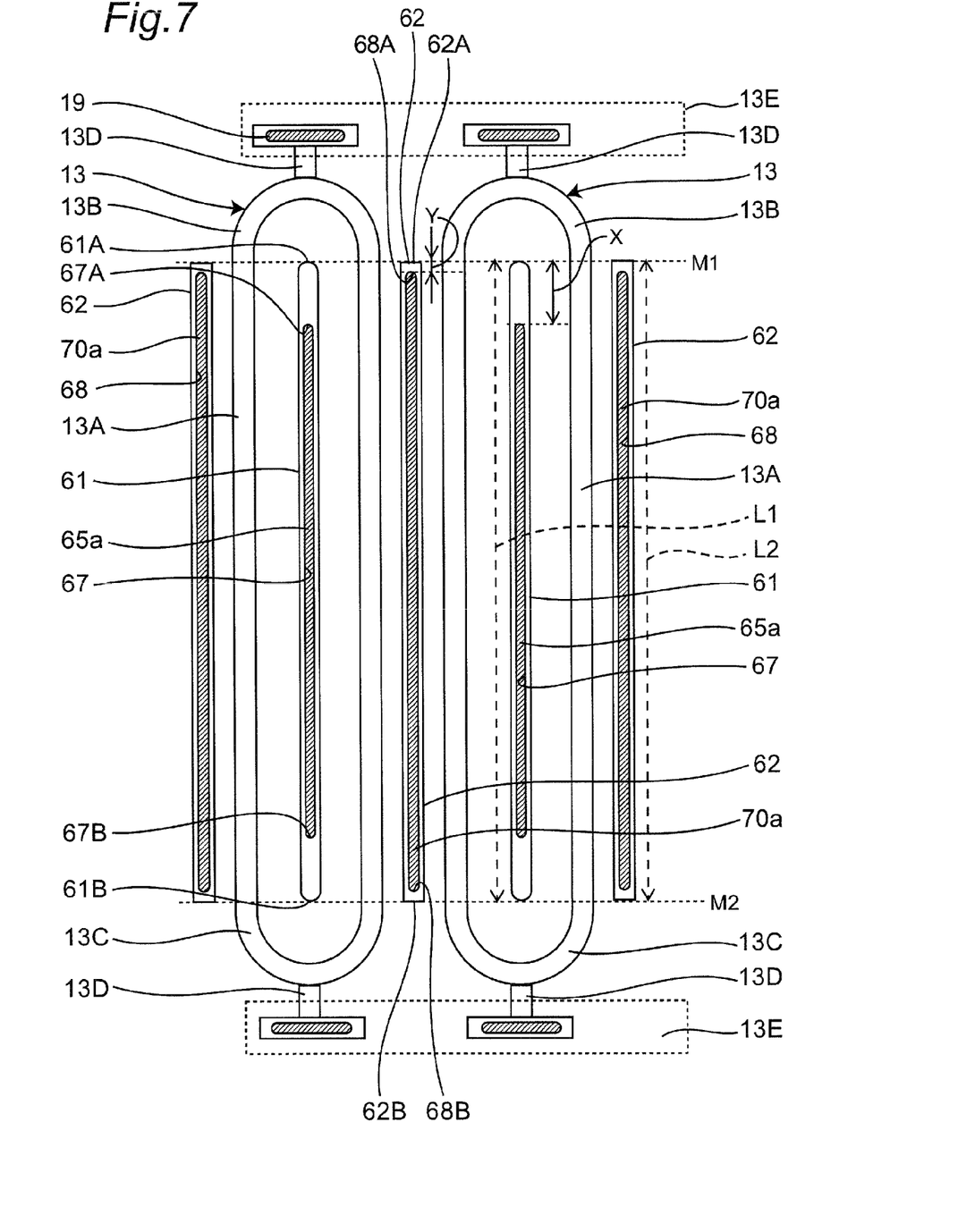
FIG. 7 is a schematic plan view illustrating an electrode structure of a GaN-based HFET according to a second embodiment of the present invention.

FIG. 7 is a schematic plan view illustrating an electrode structure of the GaN-based HFET according to the second embodiment of the present invention.

In the GaN-based HFET according to the second embodiment, as illustrated in FIG. 7, the distance X from ends 61A and 61B of drain electrodes 61 in the longitudinal direction to ends 67A and 67B of second contact portions 65a in the longitudinal direction is greater than the distance Y from ends 62A and 623 of source electrodes 62 in the longitudinal direction to ends 68A and 68B of first contact portions 70a in the longitudinal direction. However, imaginary lines M1 and M2 that extend in a transverse direction, which is perpendicular to the longitudinal direction, from the ends 62A and 62B of the source electrodes 62 in the longitudinal direction are in contact with the ends 61A and 61B of the drain electrodes 61. Thus, the only difference from the first embodiment is that the positions of the ends 62A and 62B of the source electrodes 62 in the longitudinal direction are the same as the Positions of the ends 61A and 61B of the drain electrodes 61 in the longitudinal direction.

The result of the high-temperature reverse bias test for GaN-based HFETs according to the second embodiment was as good as that for the GaN-based HFETs according to the first embodiment, and the defective rate was lower by 7% or more than the defective rate of the comparative example, which was 17.3% as shown in FIG. 4.

Thus, according to the present embodiment, similar to the first embodiment, the occurrence of an element breakdown or deterioration at the ends 17A and 17B of the second contact portions 15a can be significantly reduced, and the reliability can be increased.

In the above-described first and second embodiments, two finger-shaped drain electrodes 11, 61 and three finger-shaped source electrodes 12, 62 are provided. However, three finger-shaped drain electrodes and four finger-shaped source electrodes may instead be provided. The four source electrodes may be formed such that the source electrodes and the drain electrodes are alternately arranged in an arrangement direction of the drain electrodes. Alternatively, a single finger-shaped drain electrode and two finger-shaped source electrodes, or four or more finger-shaped drain electrodes and five or more finger-shaped source electrodes, may be provided, and the drain electrodes and the source electrodes may be alternately arranged in the arrangement direction.

In the above-described first and second embodiments, each gate electrode 13 is annular-shaped so as to surround the corresponding finger-shaped drain electrode 11. However, the curved portions 13B may be omitted.

In the above-described first embodiment, each source electrode 12 is disposed between the longitudinal ends 11A and 11B of each drain electrode 11 in the longitudinal direction. However, it is not necessary that the source electrode be disposed between both longitudinal ends of the drain electrode in the longitudinal direction. A portion of the source electrode may be disposed between both longitudinal ends of the drain electrode in the longitudinal direction. In other words, the source electrode may be located such that only one longitudinal thereof is disposed between both longitudinal ends of the drain electrode in the longitudinal direction.

Although the substrate 1 is a Si substrate in the above-described first and second embodiments, the substrate 1 is not limited to a Si substrate. A sapphire substrate or a SIC substrate may instead be used, and a nitride semiconductor layer may be grown on the sapphire substrate or the SiC substrate. Alternatively, a Ga-based semiconductor layer may be grown on a substrate made of a Ga-based semiconductor. For example, an AlGaN layer may be grown on a GaN substrate. Moreover, buffer layers may be formed between the substrate and the layers as appropriate. A hetero-improvement layer made of AlN may be provided between the undoped GaN layer and the undoped AlGaN layer. A GaN cap layer may be formed on the undoped AlGaN layer.

In the above-described first and second embodiments, the recesses that extend to the undoped GaN layer 2 are formed, and the drain electrodes 11, 61 and the source electrodes 12, 62 are formed in the recesses as the ohmic electrodes. However, the drain electrodes and the source electrodes may instead be formed on the undoped AlGaN layer, which is formed on the undoped GaN layer, without forming the recesses, and the thickness of the undoped AlGaN layer may be reduced so that the drain electrodes and the source electrodes serve as the ohmic electrodes. Alternatively, ion implantation may be performed so that the drain electrodes and the source electrodes serve as the ohmic electrodes.

Although the gate electrodes 13 are made of WN/W in the above-described first and second embodiments, the gate electrodes may instead be made of TiN. Alternatively, the gate electrodes may be made of Ti/Au or Ni/Au.

Although the drain electrodes 11, 61 and the source electrodes 12, 62 are Ti/Al/TiN electrodes in the above-described first and second embodiments, they may instead be Ti/Al electrodes, Hf/Al electrodes, or Ti/AlCu/TiN electrodes. Alternatively, the drain electrodes and source electrodes may be formed by stacking Ni/Au on Ti/Al or Hf/Al, Pt/Au on Ti/Al or Hf/Al, or Au on Ti/Al or Hf/Al.

Although the first contact portions 20a, 70a are portions of the source wires 20 in the above-described first and second embodiments, the first contact portions may instead be formed separately from the source wires. Similarly, although the second contact portions 15a, 70a are portions of the drain wires 15, the second contact portions may instead be formed separately from the drain wires.

Although the protective film 7 is made of SiN in the above-described first and second embodiments, the protective film 7 may instead be made of $SiO_2$ or $Al_2O_3$, or be formed as a multilayer film by stacking a $SiO_2$ film on a SiN film.

Although the thickness of the protective film 7 is 150 nm in the above-described first and second embodiments, the thickness may instead be set to another value in the range of 20 nm to 250 nm.

Although the interlayer insulating film 8 is made of $SiO_2$ in the above-described first and second embodiments, the interlayer insulating film 8 may instead be made of other insulating materials such as SiN, spin on glass (SOG), boron phosphorous silicate glass (BPSG), or polyimide.

In the field effect transistors according to the present invention, the GaN-based multilayer body 5 may include a GaN-based semiconductor layer expressed as $Al_X In_Y Ga_{1-X-Y} N$ ($X \geq 0$, $0 \leq X+Y < 1$). In other words, the GaN-based multilayer body may contain AlGaN, GaN, InGaN, or the like.

Although HFETs of a normally-on type are described in the first and second embodiments, similar effects can also be obtained by HFETs of a normally-off type. In addition, although Schottky gates are described, an insulating gate structure may instead be employed.

Although embodiments of the present invention have been described, the present invention is not limited to the above-described embodiments, and various modifications are possible within the scope of the present invention.

A heterojunction field effect transistor according to the present invention includes:

a GaN-based multilayer body 5 having a heterojunction;

a plurality of finger-shaped drain electrodes 11, 61 formed parallel to each other on the GaN-based multilayer body 5;

a plurality of finger-shaped source electrodes 12, 62 formed parallel to each other on the GaN-based multilayer body 5 such that the source electrodes 12, 62 and the drain electrodes 11, 61 are alternately arranged in an arrangement direction of the drain electrodes 11, 61;

gate electrodes 13 formed in regions between the drain electrodes 11, 61 and the source electrodes 12, 62 in plan view;

an interlayer insulating film 8 formed on the GaN-based multilayer body 5 so as to cover the source electrodes 12, 62, the drain electrodes 11, 61, and the gate electrodes 13;

first contact portions 20a, 70a formed in the interlayer insulating film 8 in regions above at least portions of the respective source electrodes 12, 62, the first contact portions 20a, 70a extending in a longitudinal direction of the source electrodes 12, 62; and second contact portions 15a, 65a formed in the interlayer insulating film 8 in regions above at least portions of the respective drain electrodes 11, 61, the second contact portions 15a, 65a extending in a longitudinal direction of the drain electrodes 11, 61.

A length of the first contact portions 20a, 70a in the longitudinal direction is smaller than a length of the source electrodes 12, 62 in the longitudinal direction.

A length of the second contact portions 15a, 65a in the longitudinal direction is smaller than a length of the drain electrode 11, 61 in the longitudinal direction.

For each drain electrode 11, 61, a distance X from ends 17A, 17B, 67A, 67B of the second contact portion 15a, 65a ends 11A, 11B, 61A, 61B of the drain electrode 11, 61, the ends 11A, 11B, 61A, 61B being outside the second contact portion 15a; 65a, is greater than a distance Y from ends 18A, 18B, 68A, 68B of the first contact portion 20a, 70a to ends 12A, 12B, 62A, 623 of the source electrode 12, 62, the ends 12A, 122, 62A, 62B being outside the first contact portion 20a, 70a.

In the heterojunction field effect transistor according to the present invention, the distance X from the ends 11A, 11B, 61A, 61B of the drain electrodes 11, 61 to the ends 17A, 17B, 67A, 672 of the second contact portions 15a, 65a is greater than the distance Y from the ends 12A, 12B, 62A, 62B of the source electrodes 12, 62 to the ends 18A, 18B, 68A, 68B of the first contact portions 20a, 70a. Therefore, when the high-temperature reverse bias test is performed, an electric field concentration at the ends 17A, 17B, 67A, 67B of the second contact portion 15a, 65a can be suppressed. In addition, a plurality of finger-shaped drain electrodes 11, 61 and a plurality of finger-shaped source electrodes 12, 62 are provided. Therefore, the occurrence of an element breakdown or deterioration at the ends 17A, 17B, 67A, 67B of the second contact portions 15a, 65a can be significantly reduced, and the reliability can be increased.

In one embodiment, the heterojunction field effect transistor further includes source wires 20 that are formed on the interlayer insulating film 8 and electrically connected to the source electrodes 12, 62 by the first contact portions 20a, 70a.

According to this embodiment, owing to the three-dimensional structure in which the source wires 20 are formed on the interlayer insulating film 8 and are electrically connected to the source electrodes 12, 62 by the first contact portions 20a, 70a, the chip area can be reduced.

In one embodiment, in the heterojunction field effect transistor, in plan view, the gate electrodes 13 extend in the longitudinal direction of the drain electrodes 11, 61 in the regions between the drain electrodes 11, 61 and the source electrodes 12, 62, and also extend so as to surround both ends 11A, 11B, 61A, 61B of the drain electrodes 11, 61 in the longitudinal direction.

According to this embodiment, since the gate electrodes 13 extend so as to surround both ends 11A, 11B, 61A, 61B of the drain electrodes 11, 61 in the longitudinal direction, an electric field concentration at the ends 11A, 11B of the drain electrodes 11, 61 can be suppressed in an off-state breakdown voltage test, and the static off-state breakdown voltage can be increased.

REFERENCE SIGNS LIST

1 Si substrate
2 undoped GaN layer
3 undoped AlGaN layer
5 GaN-based multilayer body
6 2DEG (two-dimensional electron gas)
7 protective film
8 interlayer insulating film
11, 61 drain electrode
11A, 11B, 61A, 61B end
12, 62 source electrode
12A, 12B, 62A, 62B end
15 gate electrode
13A longitudinal extending portion
13B, 13C curved portion
13D branch portion
13E connecting portion
15 drain wire
15a, 65a second contact portion
17, 18, 19 contact hole
17A, 17B, 67A, 67B end
18A, 18B, 68A, 68B end
20 source wire
20a, 70a first contact portion
X, Y distance

The invention claimed is:
1. A heterojunction field effect transistor comprising:
a GaN-based multilayer body having a heterojunction;
a plurality of finger-shaped drain electrodes formed parallel to each other on the GaN-based multilayer body;
a plurality of finger-shaped source electrodes formed parallel to each other on the GaN-based multilayer body such that the source electrodes and the drain electrodes are alternately arranged in an arrangement direction of the drain electrodes;
gate electrodes formed in regions between the drain electrodes and the source electrodes in plan view;
an interlayer insulating film formed on the GaN-based multilayer body so as to cover the source electrodes, the drain electrodes, and the gate electrodes;
first contact portions formed in the interlayer insulating film in regions above at least portions of the respective source electrodes, the first contact portions extending in a longitudinal direction of the source electrodes; and
second contact portions formed in the interlayer insulating film in regions above at least portions of the respective drain electrodes, the second contact portions extending in a longitudinal direction of the drain electrodes,
wherein a length of the first contact portions in the longitudinal direction is smaller than a length of the source electrodes in the longitudinal direction,
wherein a length of the second contact portions in the longitudinal direction is smaller than a length of the drain electrodes in the longitudinal direction, and
wherein, in each drain electrode, a distance X from ends of the second contact portion to ends of the drain electrode, the ends being outside the second contact portion, is greater than a distance Y from ends of the first contact portion to ends of the source electrode, the ends being outside the first contact portion,
wherein the length of the second contact portions in the longitudinal direction is smaller than the length of the first contact portions in the longitudinal direction,
wherein the second contact portions are disposed within an interval defined by the ends of the first contact portions in the longitudinal direction of the first contact portions,
wherein a length of the source electrodes in the longitudinal direction is smaller than a length of the drain electrodes in the longitudinal direction, and wherein the source electrodes are disposed within an interval defined by the ends of the drain electrodes in the longitudinal direction of the drain electrodes.

2. The heterojunction field effect transistor according to claim 1, further comprising:
source wires that are formed on the interlayer insulating film and electrically connected to the source electrodes by the first contact portions.

3. The heterojunction field effect transistor according to claim 1, wherein the gate electrodes extend in the longitudinal direction of the drain electrodes in the regions between the drain electrodes and the source electrodes in plan view, and also extend so as to surround both ends of the drain electrodes in the longitudinal direction.

4. The heterojunction field effect transistor according to claim 2, wherein the gate electrodes extend in the longitudinal direction of the drain electrodes in the regions between the drain electrodes and the source electrodes in plan view, and also extend so as to surround both ends of the drain electrodes in the longitudinal direction.

* * * * *